United States Patent [19]

Kato et al.

[11] 4,128,821
[45] Dec. 5, 1978

[54] TURRET TYPE TELEVISION TUNER

[75] Inventors: Kazuo Kato, Kyoto; Michiaki Narihiro, Ueno, both of Japan

[73] Assignee: New Nippon Electric Company, Ltd., Osaka, Japan

[21] Appl. No.: 782,416

[22] Filed: Mar. 29, 1977

[30] Foreign Application Priority Data

Oct. 12, 1976 [JP] Japan .............................. 51-122521

[51] Int. Cl.$^2$ .............................................. H03J 5/30
[52] U.S. Cl. .................................... 334/51; 74/10.41; 74/10.85; 334/57; 334/88
[58] Field of Search .................. 74/10.1, 10.15, 10.41, 74/10.7; 334/47, 49-51, 57, 88

[56] References Cited

U.S. PATENT DOCUMENTS

| | | | |
|---|---|---|---|
| 3,210,700 | 10/1965 | Krepps, Jr. et al. | 334/50 |
| 3,365,621 | 1/1968 | Von Fange et al. | 334/50 X |
| 3,407,669 | 10/1968 | Valdettaro et al. | 74/10.41 X |
| 3,477,299 | 11/1969 | Speer et al. | 74/10.41 |
| 3,944,952 | 3/1976 | Badger | 334/51 X |
| 4,052,675 | 10/1977 | Valdettaro | 334/47 X |

*Primary Examiner*—Paul L. Gensler
*Attorney, Agent, or Firm*—W. G. Fasse; W. W. Roberts

[57] ABSTRACT

The present turret type television tuner comprises a U-shaped chassis having first and second end walls joined by a side wall. A main channel selecting shaft is supported in said end walls. A toothed index wheel is mounted on the selector shaft adjacent the first end wall. A fine tuning shaft is mounted concentrically around the selector shaft. A fine tuning drive includes a first driving gear mounted concentrically on the fine tuning shaft and a second driving gear mounted on a pivotally mounted member on the second end wall. A coupling clutch permits a fine tuning operation. A torsion bar spring member including a bail portion is mounted on the first and second end walls, whereby a first resilient arm of the spring member extends along the first end wall to engage the toothed index wheel, while a second resilient arm portion extends along said second end wall to engage the selector shaft and bias it against its bearing surfaces. A rotatable turret includes a plurality of coil units and supporting discs fixed on said main shaft. Each of the coil units includes an elongated bar and coils making up a tuned circuit for each stage. The inductance of at least one of the coils is adjustable for fine tuning. A stator includes a printed circuit board and a stator bar having a plurality of spring contacts cooperating with selected coil units. The second resilient arm of the spring member provides a bias force against the selector shaft in a direction opposite to that of the spring contacts of the printed circuit board on the stator.

10 Claims, 9 Drawing Figures

TURRET TYPE TELEVISION TUNER

BACKGROUND OF THE INVENTION

The present invention relates to a compact turret type tuner arrangement used in television receivers, and more particularly, to VHF television tuners of the turret type.

Generally, mechanical channel selecting devices for VHF television tuners fall into two groups, namely, the rotary-switching type or the turret types. Turret type tuners include an incrementally rotatable channel selector shaft for selectively connecting certain ones of a plurality of tuned circuit elements to each of a plurality of channel selector positions. For example, one such turret tuner arrangement is disclosed in U.S. Pat. No. 3,210,700, wherein a rotatable turret having a plurality of tuning coil units is rotatably mounted on a chassis base. The selected coil unit is connected through terminal contacts to a stator tuning circuit on the chassis base.

The miniaturization of the structure of this kind of mechanical tuners is very difficult in comparison to the rotary switch tuners. However, since television tuners are made in large numbers, it is desirable to provide a low cost turret tuner with a minimum number of parts which may be assembled in an easy and simple manner, in order to be commercially competitive.

In conventional VHF turret tuners, each of the coil units includes an elongate insulating bar, a coil for an RF input stage, a pair of coils for an intermediate stage between the RF and mixer circuits, and a coil for the local oscillator stage. A screw is provided for fine tuning the local oscillator. These coils or windings are wound around the insulating bar, as disclosed, for example, in U.S. Pat. Nos. 3,227,981; 3,337,949; 3,521,677; and 3,594,670. In general, one of the terminal contacts of the coil winding for the oscillator is arranged on a protruding portion at the end of the insulating bar. Therefore, the dimension of turret tuners depends on the length of the protruding portion of said bar.

The conventional detent mechanism, as a means for mounting the rotatable turret on the chassis base, includes a detent wheel fixed on the selector shaft and a spring member mounted on the chassis base, as disclosed in U.S. Pat. Nos. 3,172,062 and 3,234,801. It is also known that this kind of spring member may provide resiliency in two different directions. In another type of turret tuner, a sub-assembly for the stationary circuits comprises a printed circuit board, a stator block having a plurality of strips of spring contacts, and necessary electrical elements soldered to each other, as disclosed in U.S. Pat. No. 3,365,621. Further some devices including lever members, are known as pre-setting, fine tuning devices for VHF turret tuners as disclosed in U.S. Pat. Nos. 3,316,770 and 3,183,726.

Conventional turret tuners still leave room for improvement, especially as far as minimizing the tuner size and dimension, and simplifying the assembly, as well as lowering the manufacture costs and improving the tuner performance are concerned.

OBJECTS OF THE INVENTION

In view of the foregoing, it is the aim of the invention to achieve the following objects, singly or in combination:

to provide a new turret type tuner especially for television receivers, wherein an improved, easily assembled construction minimizes and simplifies the tuner and reduces the number of required parts, and which tuner may be manufactured by sub-assembly techniques in an economic manner;

to provide a new and improved VHF tuner construction for mounting the stator assembly and the rotor assembly on the chassis base in such a sub-assembly manner that mass production methods may be employed;

to provide a low cost and small size VHF turret type tuner by simplifying its stator assembly of soldered electrical elements and by reducing the number of parts of its rotor assembly; and to provide an improved and mechanically simplified fine tuning device of the preset, memory type, wherein an improved easily constructed pivotally mounted member is provided for assuring the fine tuning of the tuner in each channel selecting position.

SUMMARY OF THE INVENTION

This invention provides a turret tuner with separable component assemblies, one of which includes a main mechanical portion and the other of which includes a main electrical portion. The mechanical portion includes a U-shaped chassis base, a rotor assembly and a spring member which couples the rotor assembly with the chassis base. The rotor assembly comprises a channel selector shaft, two or more supporters fixed to the selector shaft and a plurality of coil units which are arranged on the periphery of supporting members distributed about the selector shaft. The chassis base has exterior soldered terminals and includes a front wall and a rear wall facing each other. Each wall has a deep notch extending to the center portion. These notches are used for bearings. A spring member is mounted resiliently on the chassis base. One end of the spring member presses the selector shaft toward the base near the bearing. The other end or arm of the spring member presses resiliently against a detent wheel supported on the selector shaft. The detent mechanism comprises the spring member, the detent wheel proper and the selector shaft.

The electrical portion of the stator includes a printed circuit board, a stator bar, shield plates and electrical circuit elements. The stator bar, shield plates and circuit elements are assembled by mounting and soldering these elements on the printed circuit board.

In accordance with one aspect of the invention, there is provided a bearing mechanism for the selector shaft near the front wall of the chassis base, including a V-shaped edge of a notch in the front wall. A small diameter portion of the selector shaft is located in said notch and held in position by a resilient arm of the spring member which presses the small diameter portion of the shaft against the V-shaped edge, preferably at the inside of the front wall of the chassis base. A struck out stopper in the front wall prevents movement of the spring member and thus movement of the selector shaft out of the bearing. The biasing direction of the spring member relative to the bearing and the shaft is against the biasing direction of the spring contacts on the stator bar so as to provide a useful pressure contact with the rotor assembly, and this bias force is designed to keep the selector shaft in its proper position. These features substantially reduce the size of the tuner.

Further, in accordance with the invention, there is provided the rotor assembly having improved supporter slots with a guide portion for an easy insertion of the coil units and with a stopper portion having taper-shaped extrusions for retaining the coil units. The tapered channel selector shaft mounting includes a push nut which facilitates the detent wheel assembly.

The stator assembly of the invention includes a printed circuit board fixed to the chassis base for an easy electrical connection between the contacts on the rotor assembly and the stator assembly through the spring contacts secured to the stator bar. The outward lugs of the stator bar are located inside the chassis base to engage the lugs with cut-out portions of the chassis base. To assemble the wiring printed circuit board and stator bar in its respective position, each of the parts has lugs or cavities. The spring contacts of the stator bar are soldered to the conductive lands of the printed circuit board to provide a mechanical and electrical connection.

In accordance with the invention, there are further provided variable capacitance means including a grounded shield plate and elongated strip means as part of each spring contact. The strips are soldered together on the printed circuit board. This variable capacitance means may form a trap circuit and fine tuning means for the tuning circuits, since the stray capacitance between the strip and the shield plate can be varied to obtain the desired capacitance value for the tuning circuit due to the fact that the respective coil is at high potential relative to the ground potential of the shield plate.

In accordance with the invention, there is also provided a connecting structure between the printed circuit board and the chassis base, including inserting lugs in the printed circuit board and holes in the interior bosses as well as U-shaped notches of the side wall. These lugs and holes are available for soldering the printed circuit board on the chassis base from the outside thereof.

A further turret type VHF tuner embodiment of this invention includes a compact memory fine tuning arrangement, wherein a pivotally mounted member is made of plastic materials so as to diminish the necessary space on the front wall of the chassis base. The pivotally mounted member is a resinous molding and has the advantage of reducing the number of required parts. This member, for example, as described in the pending application Ser. No. 737,479, filed Nov. 1, 1976, includes a pivotal shaft having a head portion, a neck portion and a body portion. In the tuner of the present invention, this member is mounted on the front wall opening which is formed over the flange of the front wall, thereby to make the pivotal member flatter and smaller. Due to the opening extending to the flange, it becomes possible to fix the pivotal member to the front wall within a narrow space.

Another characteristic feature of the invention is seen in that the fixed contacts of both terminals for the local oscillator coil are situated at the center side of the coil units to reduce the outside diameter of the rotor assembly in order to make the whole assembly smaller and so as not to hinder the movement of the fine tuning element. Retaining means are provided for the wires returned from the tuning coil or winding. In addition to this improvement of the assembly, a single tuned circuit is arranged between the RF state and the mixer stage of the tuner for shortening the full length of the tuner, thereby making it smaller by more than 30% compared to the prior art type. The smaller type tuner is useful for reducing the weight of the rotor assembly and the chassis base as well as reducing the required torque. For instance, the latter is reduced by more than 10% compared to the prior art. This is enough to satisfy the performance requirements of color television sets and of black and white television sets.

BRIEF FIGURE DESCRIPTION

In order that the invention may be clearly understood, it will now be described, by way of example, with reference to the accompanying drawings, wherein.

DETAILED DESCRIPTION OF PREFERRED EXAMPLE EMBODIMENTS

Figure 1:
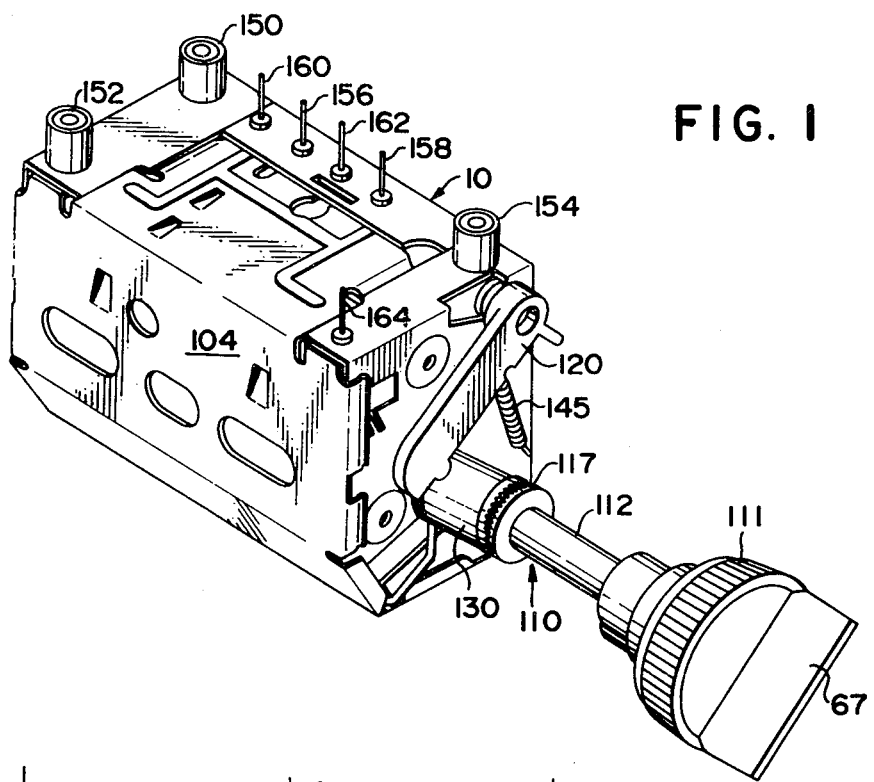
FIG. 1 is a perspective view of a tuner of this invention.
Figure 6:
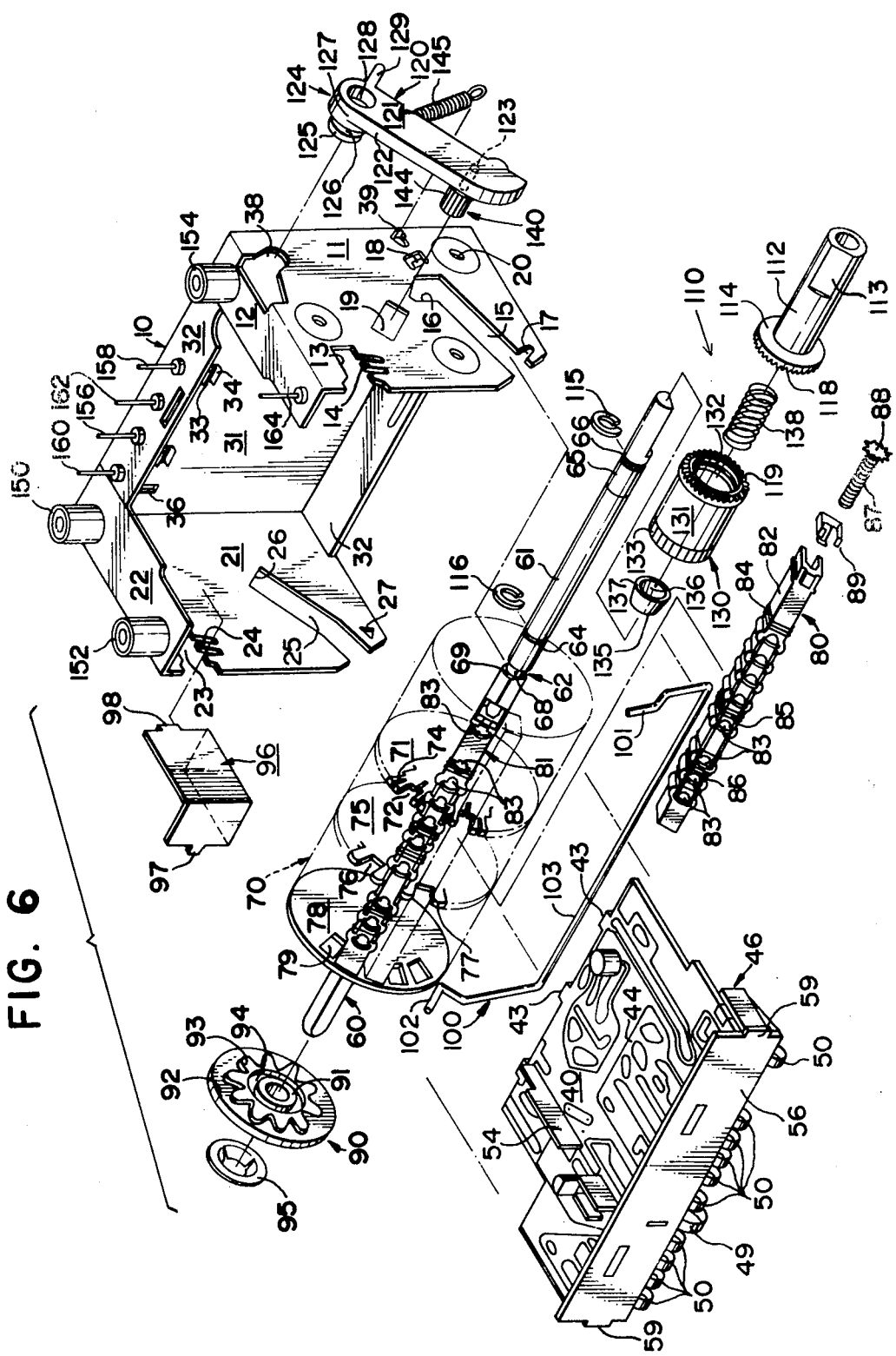
FIG. 6 is an exploded view of the tuner of FIG. 2.

The turret type VHF tuner for this invention, as particularly shown in FIGS. 1 and 6, includes three main units including a rotor assembly forming a turret 70 on a channel selector shaft 60, a stator assembly having a plurality of terminal contacts on a printed circuit board 40, and a chassis base assembly. A plurality of external connecting terminals are soldered to a chassis base 10. The selector shaft 60 is supported on the chassis base 10 for detent or ratched movement by means of a detent wheel 90 and a spring member 100. A cover 104 shields the open sides of the chassis base. A fine tuning arrangement 110 mounted on the selector shaft tunes the fine tuning circuit to the selected channel. The fine tuning arrangement may be operated by the common tuning member for each channel and is of the so-called manual type. However, in practice a memory type fine tuning arrangement is used for each channel. The embodiment shows a fine tuning arrangement of the push preset type fine tuning using an improved pivotal member.

The chassis base assembly comprises the chassis base 10 having a U-shape with a front wall 11, a rear wall 21 and a side wall 31 connected to each other. External coupling terminals are provided for a VHF input terminal 150, a UHF input terminal 152, and IF output terminal 154, a B-voltage terminal 156, an AFT terminal 158, an AGC terminal 160, a test-point terminal 162 and a UB voltage terminal 164. A phono-jack type output terminal 154 and a UB voltage terminal 164 of the feed-through capacitor type are mounted on a flange 12 of the front wall. The phono-jack type terminals 150 and 152 for the VHF and UHF inputs are mounted on a flange 22 of the rear wall. Feed-through capacitor type terminals 156, 158, 160 and 162 are mounted on a flange 31 of the side wall. Each of the flanges 12, 22 and 32 of the chassis base reinforces the chassis structure and for properly securing the shield cover 104 with ease. The chassis base 10 is provided with a number of cut-out notches or openings for receiving and mounting the parts and sub-assemblies.

Figure 7:
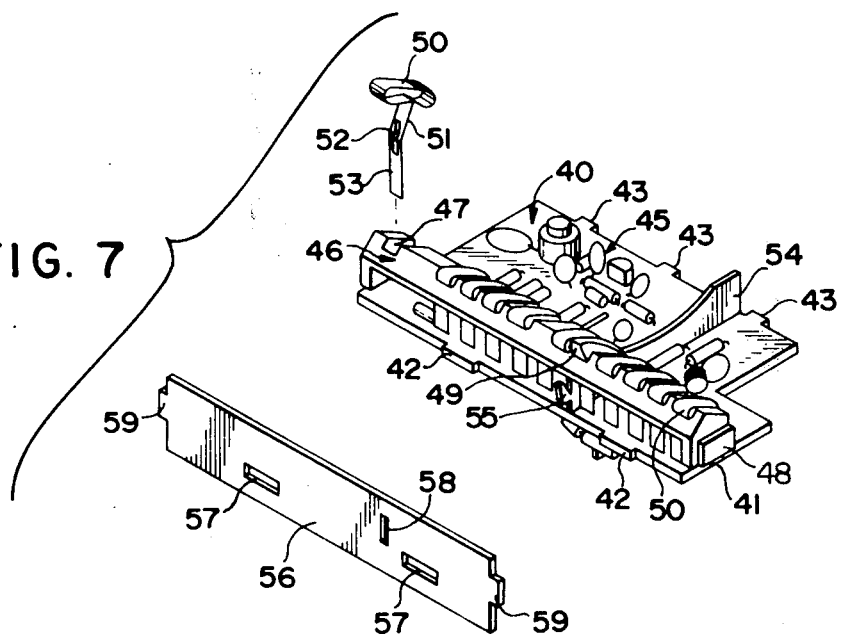
FIG. 7 is an exploded view of the stator assembly of FIG. 6.

The stator assembly is particularly shown in FIGS. 6 and 7 and comprises tuner circuit elements 45, a stator bar 46 with a plurality of stator side contacts, and center and side shield plates 54 and 56 on a printed circuit board 40. The parts are electrically and mechanically connected with the printed wiring of the electrically conductive land 44. A sub-assembly is formed by a number of the circuit elements 45 and the center shield plate 54 inserted into holes of the printed circuit board. The stator bar 46 which has a number of the spring contacts 50 inserted into each groove 47 and lead strips extending to the opposite side, is engaged with a pair of notches 41 formed in the printed circuit board 40 by its outward lugs 48. Each of the lead strips 51 is fixed to its respective hole in the printed circuit board. A pair of lugs 42 of the printed circuit board and a tongue 55 of the center shield plate are inserted in a pair of apertures 57 and into one of the holes 58 of the side shield plate 56 to secure the latter as shown in FIG. 6. These assembled parts are electrically and mechanically connected to the conductive land 44 of the printed circuit board by means of dip soldering.

Figure 4:
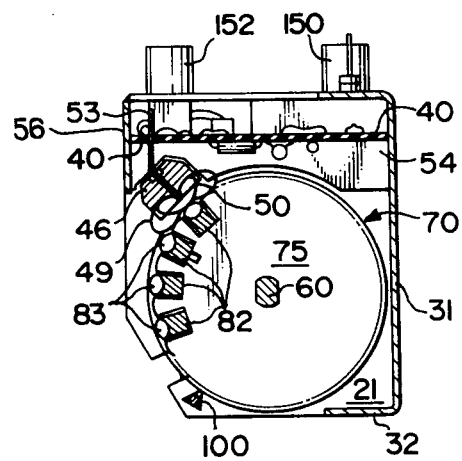
FIG. 4 is a sectional view taken along line 4—4 in FIG. 2.

The spring contacts 50 are of the flat ring type forming a contact area integral with the lead strips 51. A sufficient elasticity is provided for these contacts by the double support construction. The lead strips 51 are superposed on each other and are provided with a retaining portion 52 bent into the hole of the other strip. These retaining portions 52 secure the spring contacts 50 which are arranged in the receiving slot 47 of the stator bar 46. FIG. 4 shows that an extension 53 of the lead strips 51 extends to a point close to and opposite to the grounding land 44 or the shield plate 56, whereby trimmer capacitor means are formed for the adjustment of any stray capacitance. The small capacitance existing between the spring contact 50 and ground may be changed by bending the extension 53 of the spring contact 51 which is at high potential, whereby a trimmer capacitor is provided in the tuned circuit. The stator bar 46 carries, for example, ten ordinary spring contacts 50 and one earth contact 49 which, in the assembled state, touches the peripheral surface of the metallic support of the rotor assembly.

Figure 2:
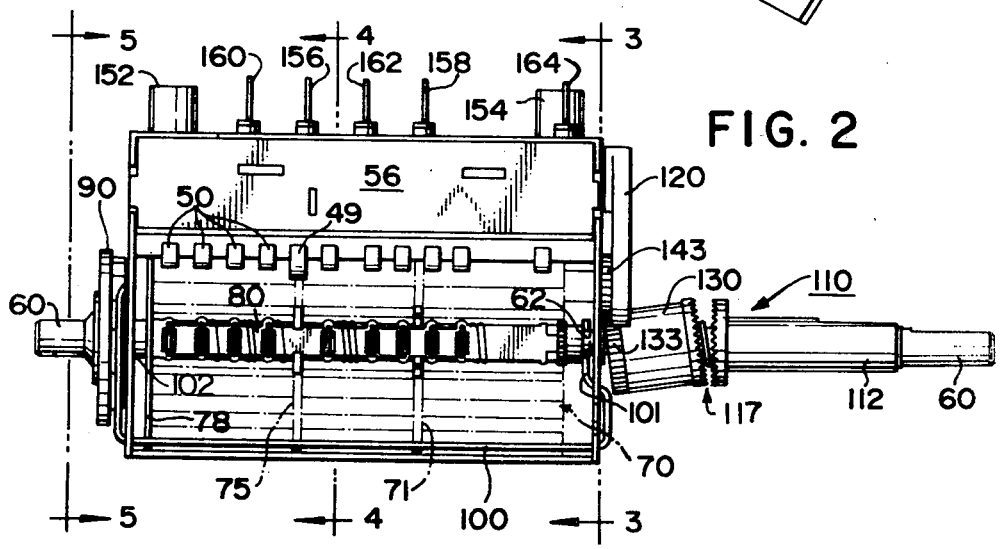
FIG. 2 is a side view of the tuner of FIG. 1, with the knob and the shield cover removed.

The rotor assembly, particularly shown in FIGS. 2 and 6, comprises the selector shaft 60, the rotatable turret 70 and the detent wheel 90 secured to the selector shaft 60. Three support discs or members are secured to the shaft 60. The support disc 71 is made of plastic material. The support 75 and the end support 78 are of metal. The detent wheel 90 of the detent mechanism is held by a pushnut 95 on the shaft 60, whereby the supports 71, 75, and 78 are also held in position. The selector shaft 60 comprises a metal section 61 for mechanical strength and the insulating plastic portion 65. The metal section 61 determines the installed position of the mounted parts by means of the chamfered and tapered shape of the metal section 61.

The detent wheel 90 has a hub 91, a flange 92 and a cam 93 made by plastic moldings, preferably with a groove 94. The wheel 90 is secured to the rear end of the selector shaft 60 by means of the push nut 95. The metal section 61 of the selector shaft 60 is strong enough to support the rotor assembly. The plastic portion 65 is secured or coupled to the front end of the metal section 61. The plastic portion 65 is provided with slots 62 which form the bearings of the selector shaft. The supporting portions 16 and 26 of the chassis base 10 fit correctly into the bearing slots 62. The forward end of the selector shaft 60 has grooves 64 and 66 which hold the assembled parts of the fine tuning arrangement 110. Groove 64 is in the metal section 61. Groove 66 is in the plastic portion 65 and may be provided with a projection acting as a stopper. The fine tuning arrangement 110 is assembled on the section 61. The channel selector is secured at the chamfered front end of the plastic portion 65. In order to facilitate the shaft assembly, the slot 62 in the front end is wider than the thickness of the front wall 11. The slot 62 forms a peripheral surface 68 of small diameter and an edge surface 69.

The turret 70 comprises twelve VHF coil units 80 for the VHF channel and one UHF coil unit for the UHF channel. These coils are inserted into respective receiving notches 72, 76 and respective receiving openings 79 in each support disc 71, 75 and 78. Each coil unit is made of an insulating rod 82 and windings wound around the rod between fixed contacts 83 of the rotor assembly. For example, the coil unit 80 for the VHF channel includes an oscillation coil 84 of the local oscillator stage and extends from the front end of the rod 82, a mixing coil 85 of the mixer stage and an RF input coil 86 of the RF input stage. In order to adjust the inductance of the local oscillator stage, a fine tuning member or adjusting element 87 is disposed within the coil and supported on a resilient retainer 89. The fine tuning member 87 has a pinion gear 88 attached to its head portion and acts as a memory fine tuning by means of the fine adjusting torque transmitted from the fine tuning arrangement 110.

Figure 9:
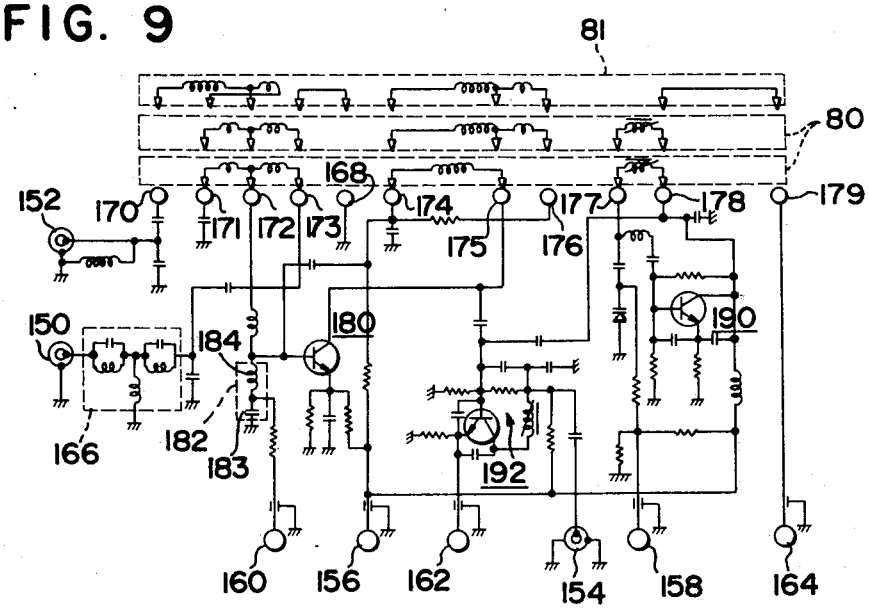
FIG. 9 is an electrical circuit diagram of the tuner of FIG. 1.

Different contact positions are provided for each resonance coil of the respective channel. These contacts are connected to the respective circuit through the stator tuner circuit. For example, as shown in FIG. 9, the terminal contacts for the VHF coil unit 80 are different for the high channel and the low channel. When the UHF coil unit 81 is used as a UHF amplifier, an additional contact of the UHF coil unit is used to supply the "+B" voltage to the UHF tuner instead of the coil terminal for the local oscillator in the VHF band. To support each of the coil units 80 and 81, the tail end of each coil unit is inserted in the receiving opening 79 of the resilient end support disc 78. Therefore, any movement in the radial direction of the coil units is limited. The front portion of each coil unit is secured in the receiving notch 72 of the plastic support disc 71. Hence, all directional movement of these coil units is limited. The middle section of each coil unit is supported by the receiving notch 76 of the metal support disc 75 which is also used as an RF shield. The metal support disc 75 shields the RF input coil 86 from the mixing coil 85 and is grounded through the earth contact 49 which is always maintained in sliding contact with the peripheral surface 77 of its support.

The receiving notch 72 of the plastic material support disc 71 in the rotatable turret 70 is improved by a radially inwardly extending slot 74 to facilitate the assembly of the insulating rod 82 in the plastic material support disc 71. The slot 74 permits the extending of the plastic material support disc 71 due to its elasticity. Moreover, the receiving notch 72 forms a guide and retaining means for the insulating rod 82, whereby the insulating rod 82 is easily mounted but cannot easily come off after the mounting. The terminal contacts 83 of the oscillation coil 84, for the VHF coil unit 80, are aligned in parallel on the same axis near the plastic material support disc 71. Especially, the rod surface of the oscillation coil section is a rough surface to prevent slipping of the oscillation coil. Another method to prevent such coil slipping is to hook the coil wire to a projection formed on the rod and to cement the coil wire with bonding material.

Figure 5:
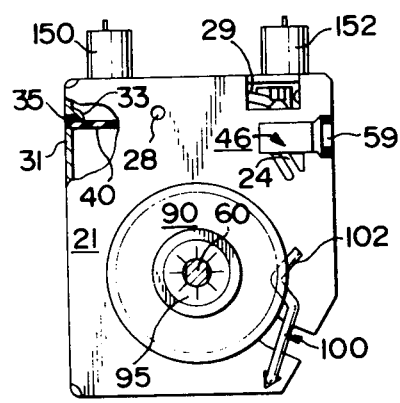
FIG. 5 is a sectional view taken along line 5—5 in FIG. 2.

For setting up the stator assembly in the chassis assembly, the front wall 11 and the rear wall 21 of the chassis base 10 is provided with cut-out stator receiving members 13 and 23. The edge portion of the stator bar 46 is inserted in the cut-outs 13 and 23. In addition, the tongues 14, which extend to cut-outs 13 and 23, are provided to retain the stator bar. After the stator bar is inserted, the tongue 14 is bent to fix the stator bar in position. Moreover, as especially shown in FIG. 5 and FIG. 6, the interior boss 33 on the side wall 31, facilitates the soldering of the ground land 44 of the printed circuit board 40 to the chassis base 10, and the printed circuit board lugs 43 are inserted into the printed circuit board receiving holes 34. By soldering the interior boss 33 from outside of the chassis base 10, the printed circuit board 40 and the side wall 31 are joined electrically and mechanically. This kind of attachment by soldering is of great advantage since it improves the efficiency of the assemblying work when the printed board is attached in the chassis base.

The rotor assembly is mounted to chassis base 10 in the two notches 15 and 25 provided in the sidewalls 11 and 21 to receive the channel selector shaft 60. The bearing portions 16 and 26 at the end of the respective notch are substantially V-shaped.

The slots or grooves 62 in the channel selector shaft 60 engage the support or bearing portions 16 and 26, whereby the shaft 60 extends in parallel to the stator bar 46 on the printed circuit board. The shaft 60 may rotate in a ratched or detent manner due to the resilient force applied by a single spring member 100.

The single spring member 100 comprises a first arm 101, a second arm 102, and a bail 103 which joins the two arms. The bail 103 is inserted in the slot 17 of the front wall 11 and in the spring receiving hole 27 of the rear wall 21. The first arm 101 directly contacts the channel selector shaft 60 in the chassis base 10. The second arm 102 directly contacts the cam surface of the detent wheel 90. These contacts or engagements determine the position of the channel selector shaft 60 due to the spring elasticity of the bail 103, whereby the slots or grooves 62 of the channel selector shaft 60 are pressed against the bearing portions 16, 26 in the chassis base 10.

The biasing direction of each arm is opposite to that of the other arm. One biasing force is directed in the same direction as the biasing force of the spring contacts, whereby the assembling work is made easy and, whereby the rotor rotates smoothly. The first arm 101 on the front wall 11 engages the channel selector shaft 60 with a resilient biasing force applied to the bearing portion. The first arm is located to contact the peripheral surface 68 and the edge surface 69 of the slot 62 in the channel selector shaft 60. Therefore, the first arm 101 is held in its position against movement in the direction of the longitudinal shaft axis so as to be effective for applying the required rotary torque of the channel selector shaft.

Figure 3:
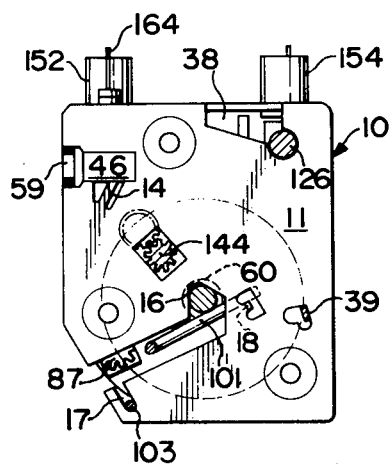
FIG. 3 is a sectional view taken along line 3—3 in FIG. 2.

As shown in FIG. 3, an internal struck-out stopper 18 is provided on the front wall, whereby any deviation of the channel selector shaft 60 and/or of the first arm 101 from the correct position is prevented. Thus, the structure of this invention is effective to reduce the number of parts, to facilitate the assembling work, and to minimize the overall size of the tuner. To use the space of the chassis base efficiently, the first arm 101 of the spring member 100 biases the channel selector shaft 60 from the outside inwardly through the notch in the front wall 11. This is one of the important features of the invention equal to that of the struck-out stopper 18 on the front wall, and equal to using a single torsion spring member 100. Accordingly, the channel selector shaft 60 is held in the proper bearing or support even if an abnormal force of radial direction is exerted upon the channel selector shaft 60.

The chassis base 10 is assembled as follows. First, the IF trap circuit 166, shown in FIG. 9, is mounted below the VHF input terminal 150 and is accommodated within the IF shield case 96, the tongues 97 and 98 of which are inserted and soldered to the IF trap holes 28 and 36 of the rear wall and the side wall, respectively. Next, the printed circuit board is mounted in the chassis base 10 in which the center shield plate 54 and side shield plate 56 extending at right angles to each other, are rigidly secured on the printed circuit board and are grounded through the land 44. The pair of lugs 59 of the side shield plate 56 are soldered and grounded to the chassis base 10. The lugs 43 are joined with the side wall 31 by soldering, for securing the printed circuit board.

Figure 8:
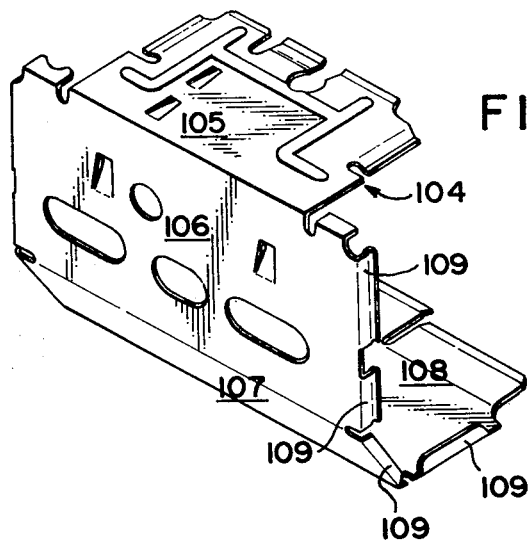
FIG. 8 is a cover of the tuner of FIG. 1.

Thereafter, the rotor assembly is set to rotate in a ratchet or detent manner under the restraint or force of the single torsion spring member 100 which presses the channel selector shaft 60, due to the resilient force of the member 100. Though each assembly has been tested and adjusted prior to its mounting, these assemblies are tested again after the mounting is completed. The shield cover 104 is attached in the opening of the chassis base 10. The shield cover 104, as shown in FIG. 8, comprises a top plate 105, a side plate 106, an inclined plate 107 and a bottom plate 108 to be easily attached to the chassis base 10. The side plate 106 is bent at a right angle to the top plate 105 and is bent at 150 degrees to the inclined plate 107 which is bent 120 degrees to the bottom plate 108. Consequently, the side plate 106 is bent at a right angle to the bottom plate 108. The shield cover 104 is attached to the chassis base 10 in such a manner that a good electrical connection is established due to its spring function. A retaining edge 109 acts as a flange which contacts the front wall 11 and the rear wall 21. The edge 109 is provided on the side plate 106, on the inclined plate 107 and on the bottom plate 108. Moreover, at the top plate 105 and the bottom plate 107 the struck-out members are provided to contact the flanges 12, 22 and 32 of the chassis base 10. An interior boss is provided at the shield cover 104 to form a test point or terminal for the adjustment of the tuner.

The VHF and UHF channel sections may be varied with the knob 67 in a detent or ratchet manner by the just described structure. For selecting a VHF channel, the push preset fine tuning arrangement 110 is provided. This arrangement is shown in FIGS. 1, 3 and 6, and is fixed to the front wall 11 of the chassis base 10 and to the channel selector shaft 60, which comprises a fine tuning shaft 112 with a knob 111. A pivotally mounted member 120 is always biased against the fine tuning shaft and mounted on the front wall 11. A first driving gear 130 is mounted on the same axis as the fine tuning shaft. A second driving gear 140 is supported by a pivotally mounted member, and by coupling means 117 for driving the pivotally mounted member to a second position from a common first position. The fine tuning shaft 112, the first driving gear 130, and coupling means 117 are mounted on the channel selector shaft 60. The pivotally mounted member 120 and the second driving gear 140 are mounted on the front wall 11. In FIG. 6, the assembly of the channel selector shaft 60 includes a rear retaining washer 116 in a groove 64 of the channel selector shaft 60 for holding in place a bearing sleeve 135, a cylindrical sleeve 131, and a coiled spring 138. The fine tuning shaft 112 is retained on the channel selector shaft 60 by a front washer 115 in the groove 66 of the channel selector shaft. The fine tuning shaft 112 is biased against the front washer 115. A coupling means 117 is provided by relatively small teeth 118 on a tube edge 114 on the fine tuning shaft 112 and relatively small second teeth 119 on the front edge of the cylindrical sleeve 131. By pushing the fine tuning shaft 112, a coiled spring 138 which is placed between the enlarged hole 136 at the front edge of the receiving sleeve and the tube portion 114 of the fine tuning shaft, is compressed, thereby completely coupling with the cylindrical sleeve 131 on the same axis.

The cylindrical sleeve 131 has circular projections 132 on the inside surface and gear teeth 133 at the rear peripheral surface. This cylindrical sleeve is inclined, unless the fine tuning arrangement 110 is operated, at the fulcrum where the circular projections 132 are in touch with the sharp corner 137 around the bearing sleeve 135 (see FIG. 2). For pushing and rotating the fine tuning shaft 112, the gear 133 of the cylindrical sleeve 131 drives the adjusting element 87 of the coil unit 80 through the second driving gear 140.

The pivotally mounted member 120 is assembled on the front wall of the chassis base 10 and comprises a lever plate 121 holding an idler shaft 123 for the second driving gear 140 at one end portion of the lever plate 121 and a pivotal shaft 124 at another end portion. These elements are molded integrally from plastic material just as is a frame member 122. The pivotal shaft 124 has a head portion 125, a neck portion 126, and a body portion 127 with a cavity 128 and a projected portion 129 of molded plastic material substantially of the same thickness. A member 120 is pivotally mounted to the front wall by inserting the neck portion 126 into the opening 38 of the front wall, after the second driving gear member is attached to its idler shaft. The lever tension spring 145 is hooked between the struck-out portion 39 and the hole of a pivotally mounted member (not shown) in order to continuously bias the pivotally mounted member 120 against the fine tuning shaft. As a result, both the second driving gear 140 on the idler shaft and the pivotally mounted member 120 are kept in a first position, out of fine tuning state, whereby the channel selector shaft 60 may be rotated. As shown in FIG. 6, the second driving gear 140 is rotatably mounted on said idler shaft 123 held in the pivotally mounted member 120, and comprises a gear 143 shown in FIG. 2 engaged with the gear 133 of the first gear 130. A pinion 144 passes through a hole 19 in the front wall 11 in order to engage with the pinion gear 88 of the adjusting element 87 (FIG. 3) of the selected one of the VHF coil units 80. The engagement or disengagement between the pinion gear 88 and the pinion 144 depends on the position of the pivotally mounted member 120. In other words, rotation of the fine tuning shaft 112 under the pushed state is transmitted to the second driving gears 140 and the adjusting element 87 which moves within the coil to enable the fine tuning. Heretofore, the fine tuning arrangement has been described for a push pre-setting type. However, the rotary pre-setting one is also able to easily apply for the invented tuner.

FIG. 9 illustrates the electrical circuit of the VHF tuner of the present invention including three terminals of phono-jacks 150, 152, 154 and five terminals of feed-through capacitor types 156, 158, 160, 162 and 164 make it possible to connect the tuner to external circuits.

The input signal from the VHF input terminal 150 is supplied to the fourth terminal 174 of the spring contact 50 through an IF trap circuit in a shielded casing and a capacitor connecting to the stator assembly. Moreover, the input signal is tuned at the VHF coil unit and amplified in an RF stage 180 within an AGC signal from an AGC terminal. The high channel image trap 182 is characterized by the cooperation of a matching capacitor 183 and an inductor 184. On the other hand, the signal from the local oscillator 190 is mixed in the mixing stage 192 with the RF amplified signal, whereby an IF output signal is formed and supplied to the output terminal 154. A coupling circuit between the RF stage and the mixing stage is a single tuning circuit. For receiving a low channel signal, the coil between the 6th and the 7th terminals 176, 177 is divided which makes it possible to adjust the dumping effect with a dumping resistor. Although the circuit shown here is provided with a bipolar transistor as an amplifying element, FET and some other transistor type make up the circuit.

In the above mentioned tuner, a reduction in the number of parts and improvements of the parts have been achieved. Particularly, the shaft supporting structure has been improved by the arm portion of the spring member resiliently fixed in the chassis base 10, immediately adjacent to the small diameter portion of the selector shaft so that the torque of the selector shaft can be leveled and decreased at fifteen percent, consequently the resettability and the feeling of detent operation are improved. Not only decreasing of the selector shaft torque, but also the simplification of the fine tuning arrangement makes a great contribution to the reducing in size of the tuner. In a practical example, the rotor assembly has a diameter of 40mm and an axial length of 69mm. The chassis base is, for example, 46 × 55 × 78mm. In comparison with a conventional tuner of the same type, the size of the present tuner is reduced by about 40%. Another advantage of the present tuner is seen in that its selector shaft provides a torque of about 4.5 kilogram-centimeters. The push stroke of the shaft is within the range of 2 to 3 mm. Although the invention has been described with reference to specific example embodiments, it is to be understood, that it is intended to cover all modifications and equivalents within the scope of the appended claims.

What is claimed is:

1. A turret type tuner comprising a chassis assembly including a front wall means, rear wall means, and side wall means, a plurality of external connecting terminals operatively secured to said wall means, a rotor assembly including turret means, and selector shaft means, detent biasing means on said selector shaft means, and a plurality of coil units operatively arranged in said rotor assembly, a stator assembly including a stator bar and a plurality of spring contacts as well as a tuner circuit means including electrical circuit elements, a shield plate and printed circuit board means electrically and mechanically connected to said spring contacts and to said electrical circuit elements, bearing fitting means provided in said chassis assembly to mount said rotor assembly and said stator assembly, and torsion bar spring means having interconnected first and second arm means forming bearing means and a detent drive for said selector shaft means, said detent drive employing the torsional force of said torsion bar spring means, said bearing fitting means comprising notch bearing means formed in said front wall means and indent bearing means formed on said selector shaft means, said indent bearing means being located in said notch bearing means and wherein said torsion bar spring means is operatively arranged to apply pressure to the selector shaft means in said indent bearing means at the inside of said front wall means through said first arm means of said torsion bar spring means.

2. The tuner of claim 1, wherein said first arm means of said torsion bar spring means are effective on said front wall means in a direction opposite to that of said spring contacts on the stator bar, said front wall means including stopping means arranged to stop the movement of said torsion bar spring means against its pressure direction so that the selector shaft means holds in a stopped position even if the selector shaft is extraordinarily loaded.

3. The tuner of claim 2, wherein said stopping means comprise a struck-out portion of said front wall means extending in the axial direction and located near the side opposite of the side where said first arm means engages said selector shaft means.

4. The tuner of claim 1, wherein said detent biasing means of the rotor assembly includes a detent wheel made of plastic material and a push nut for retaining said detent wheel, said tuner further comprising supporting means for said coil units, said supporting means including one support member of plastic material and two metal support members, said support member of plastic material being provided with receiving notches, each of which has a guide portion and an inclined retaining portion so that said coil units are removable.

5. The tuner of claim 1, wherein said front wall means and said rear wall means of said chassis assembly comprise cut-outs and flexible tongues in the stator receiving portions of said wall means for securing said stator assembly to said chassis assembly by fitting both ends of said stator bar into said cut-outs and wherein said stator assembly is mechanically fixed by said flexible tongues extending from said stator receiving portions of said wall means.

6. The tuner of claim 1, wherein said side wall means has interior bosses in which said printed circuit board means is fitted vertically, and means electrically and mechanically interconnecting said bosses with said printed circuit board means.

7. The tuner of claim 1, wherein said spring contacts comprise an elongated portion, said tuner further comprising grounding means, said elongated portion being flexible and arranged for cooperation with said grounding means to vary the grounding capacitance of said spring contacts for a circuit tuning adjustment.

8. The tuner of claim 1, further comprising fine tuning means for fine tuning a selected channel, wherein said fine tuning means comprises an adjusting element attached to each coil unit, a fine tuning shaft, first and second driving gears, a pivotally mounted member, and a coupling means for pre-setting a memory type fine tuning.

9. The tuner of claim 8, wherein said pivotally mounted member of the fine tuning means is made of plastic material and provided with a head portion, a neck portion, and a body portion, said neck portion being mounted to a notch formed in the front wall and its flange, whereby an engagement between said adjusting element and said fine tuning arrangement is removable.

10. The tuner of claim 1, further comprising shield cover means for shielding opening portions of said chassis assembly, said shield cover means including opposite parallel plate portions, a side plate portion, and an inclined plate portion, thereby facilitating the attachment of said shield cover means.

* * * * *